US012572710B2

(12) United States Patent
Nomura et al.

(10) Patent No.: US 12,572,710 B2
(45) Date of Patent: Mar. 10, 2026

(54) SUPPORT APPARATUS, DESIGN SUPPORT METHOD, AND NON-TRANSITORY COMPUTER READABLE MEDIUM STORING A COMPUTER PROGRAM

(71) Applicant: Kabushiki Kaisha Zuken, Kanagawa (JP)

(72) Inventors: Seiji Nomura, Kanagawa (JP); Takuma Matsumoto, Kanagawa (JP)

(73) Assignee: Kabushiki Kaisha Zuken, Kanagawa (JP)

( * ) Notice: Subject to any disclaimer, the term of this patent is extended or adjusted under 35 U.S.C. 154(b) by 839 days.

(21) Appl. No.: 17/951,348

(22) Filed: Sep. 23, 2022

(65) Prior Publication Data

US 2023/0015021 A1    Jan. 19, 2023

Related U.S. Application Data

(63) Continuation of application No. PCT/JP2020/014225, filed on Mar. 27, 2020.

(51) Int. Cl.
*G06F 30/12*          (2020.01)
*G06T 15/20*          (2011.01)

(52) U.S. Cl.
CPC ............ *G06F 30/12* (2020.01); *G06T 15/205* (2013.01)

(58) Field of Classification Search
CPC .... G06F 30/12; G06F 2115/12; G06F 30/367; G06T 15/205; G01R 29/08
See application file for complete search history.

(56) References Cited

U.S. PATENT DOCUMENTS

| | | | | |
|---|---|---|---|---|
| 11,953,536 | B2 * | 4/2024 | Tanimoto | ........... G01R 29/0878 |
| 2003/0231145 | A1 | 12/2003 | Uesaka et al. | |
| 2006/0132118 | A1 * | 6/2006 | Maekawa | .......... G01R 29/0871 |
| | | | | 324/96 |
| 2011/0296362 | A1 * | 12/2011 | Ishikawa | ................. H01L 22/12 |
| | | | | 716/112 |
| 2015/0293162 | A1 | 10/2015 | Tsukamoto et al. | |

FOREIGN PATENT DOCUMENTS

| | | | |
|---|---|---|---|
| EP | 1376143 | A2 | 2/2004 |
| JP | 2002-149720 | A | 5/2002 |
| JP | 2004-020403 | A | 1/2004 |
| JP | 2006-309704 | A | 11/2006 |
| WO | 2010/090152 | A1 | 8/2010 |

OTHER PUBLICATIONS

Extended European Search Report issued on Apr. 14, 2023 in counterpart European Patent Appln. No. 20927555.1.
International Search Report and Written Opinon issued in corresponding parent International Application No. PCT/JP2020/014225 dated Jun. 16, 2020.

* cited by examiner

*Primary Examiner* — Chuen-Meei Gan
(74) *Attorney, Agent, or Firm* — Venable LLP

(57) ABSTRACT

A design support apparatus includes an acquisition unit configured to acquire an electromagnetic wave image in which a captured image obtained by capturing an electronic device and a map obtained by mapping, in a two-dimensional space, a measurement result of an electromagnetic wave radiated from the electronic device are superimposed, and a composition unit configured to cause a display unit to display a CAD drawing representing a shape of the electronic device and the electromagnetic wave image in a superimposed manner such that the CAD drawing and a device image that is an image of the electronic device in the captured image are aligned.

18 Claims, 11 Drawing Sheets

F I G. 1
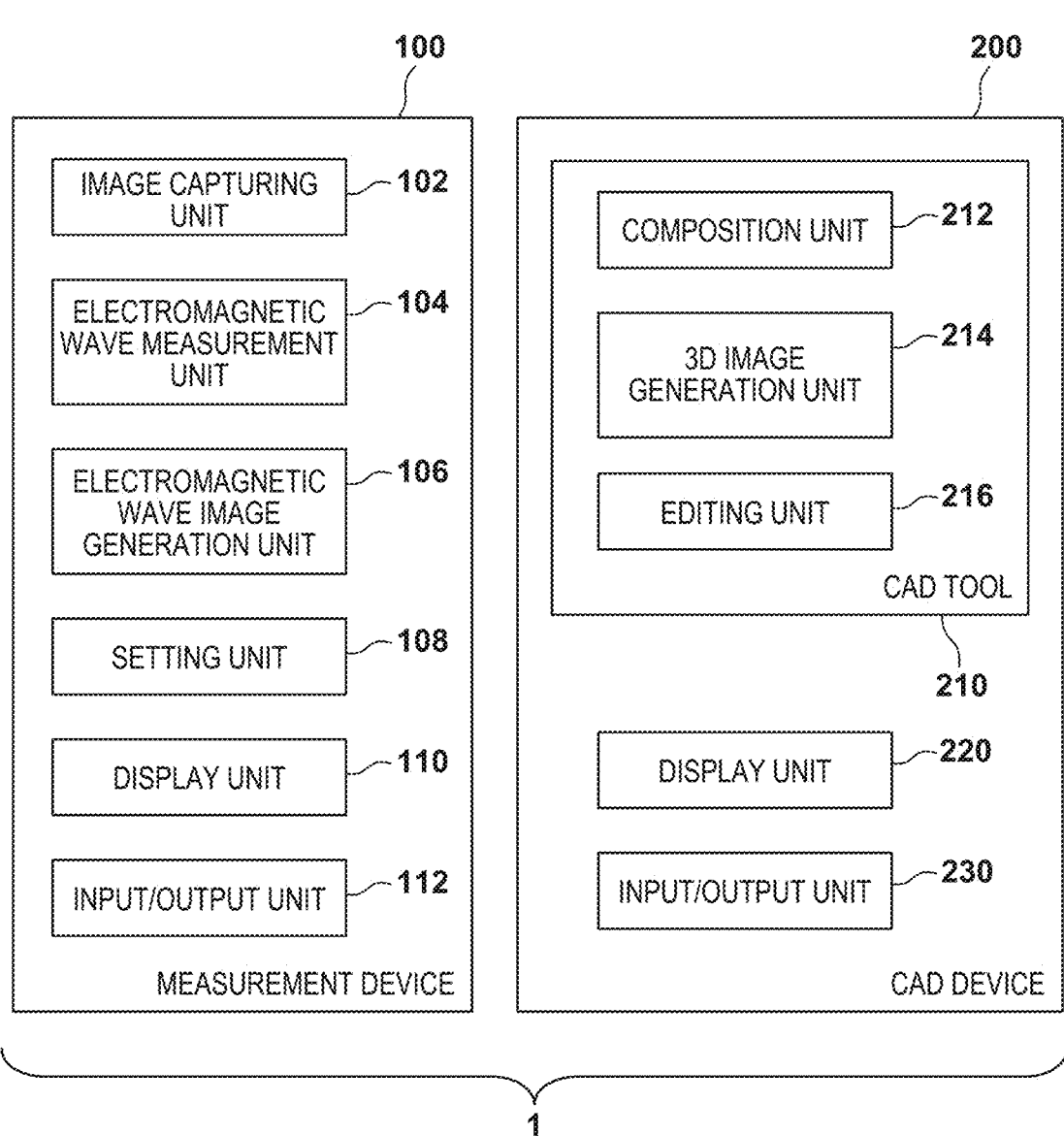

F I G. 2
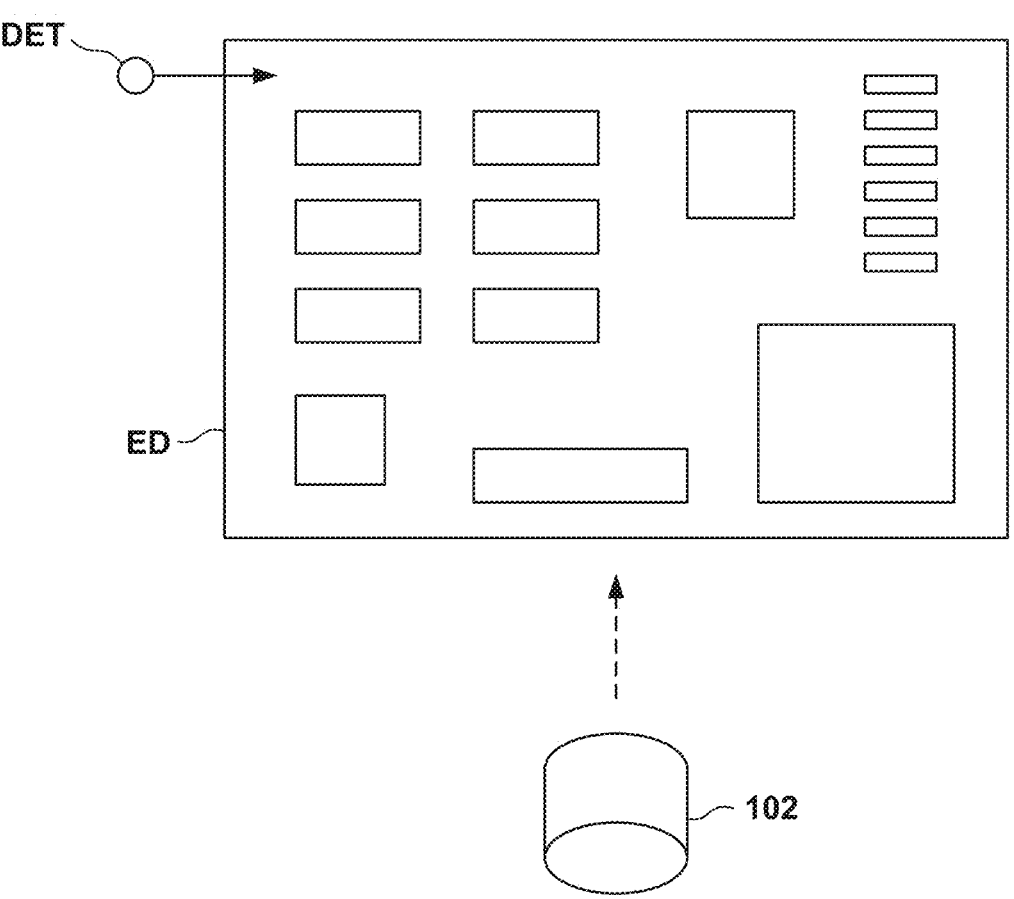

F I G. 3
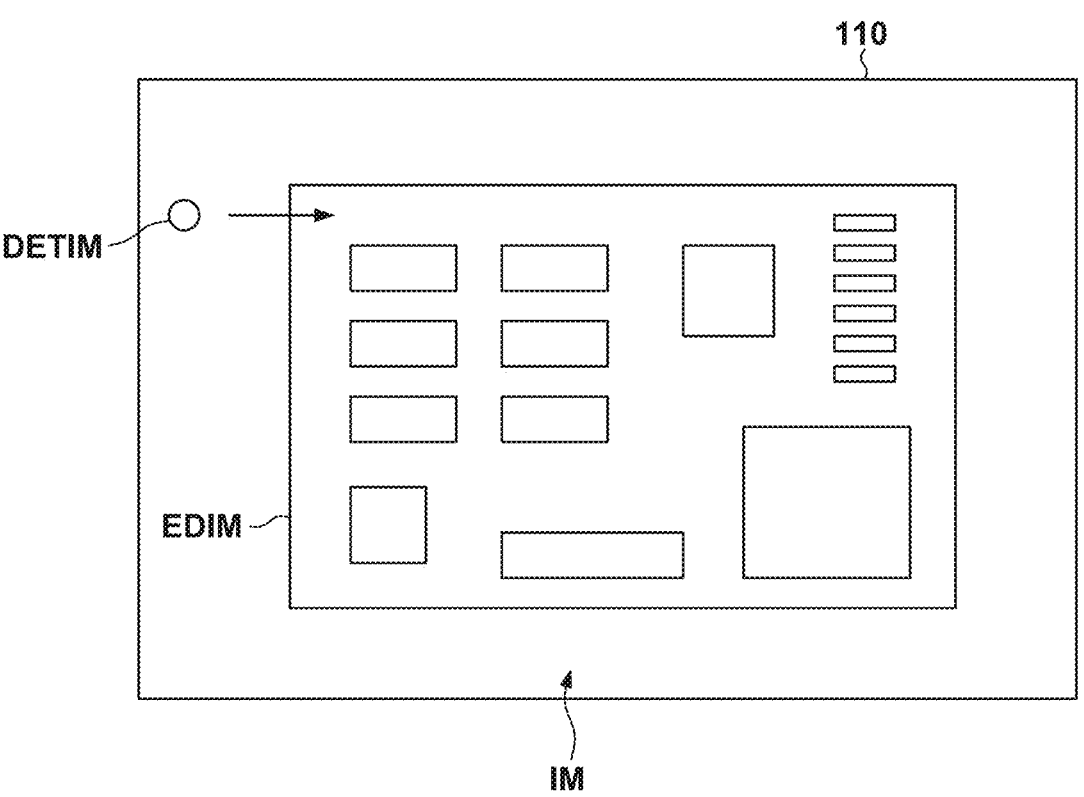

FIG. 4

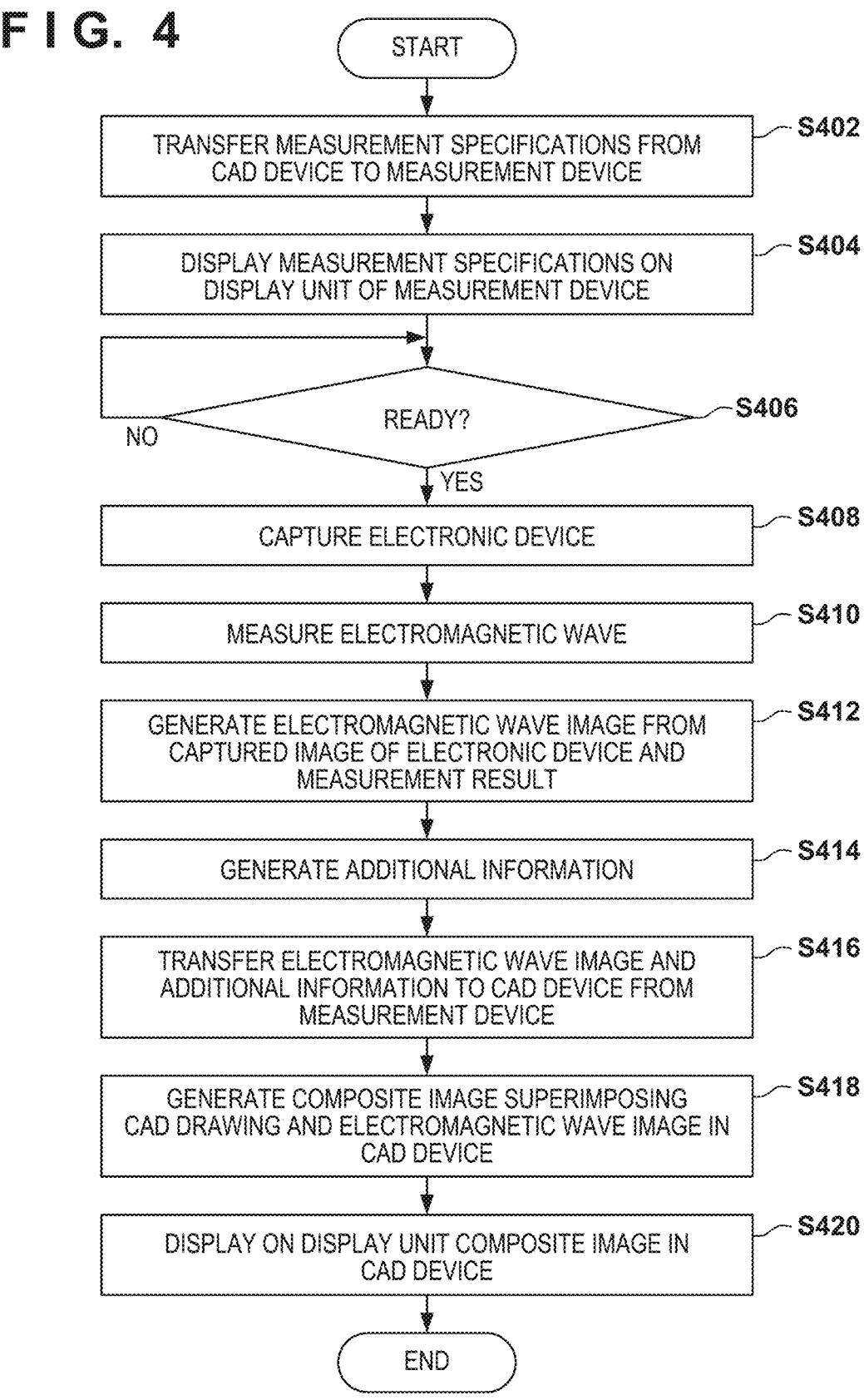

START

TRANSFER MEASUREMENT SPECIFICATIONS FROM
CAD DEVICE TO MEASUREMENT DEVICE — S402

DISPLAY MEASUREMENT SPECIFICATIONS ON
DISPLAY UNIT OF MEASUREMENT DEVICE — S404

READY? — S406
NO
YES

CAPTURE ELECTRONIC DEVICE — S408

MEASURE ELECTROMAGNETIC WAVE — S410

GENERATE ELECTROMAGNETIC WAVE IMAGE FROM
CAPTURED IMAGE OF ELECTRONIC DEVICE AND
MEASUREMENT RESULT — S412

GENERATE ADDITIONAL INFORMATION — S414

TRANSFER ELECTROMAGNETIC WAVE IMAGE AND
ADDITIONAL INFORMATION TO CAD DEVICE FROM
MEASUREMENT DEVICE — S416

GENERATE COMPOSITE IMAGE SUPERIMPOSING
CAD DRAWING AND ELECTROMAGNETIC WAVE IMAGE IN
CAD DEVICE — S418

DISPLAY ON DISPLAY UNIT COMPOSITE IMAGE IN
CAD DEVICE — S420

END

110

110,220

110,220

110,220

220

F I G.  10
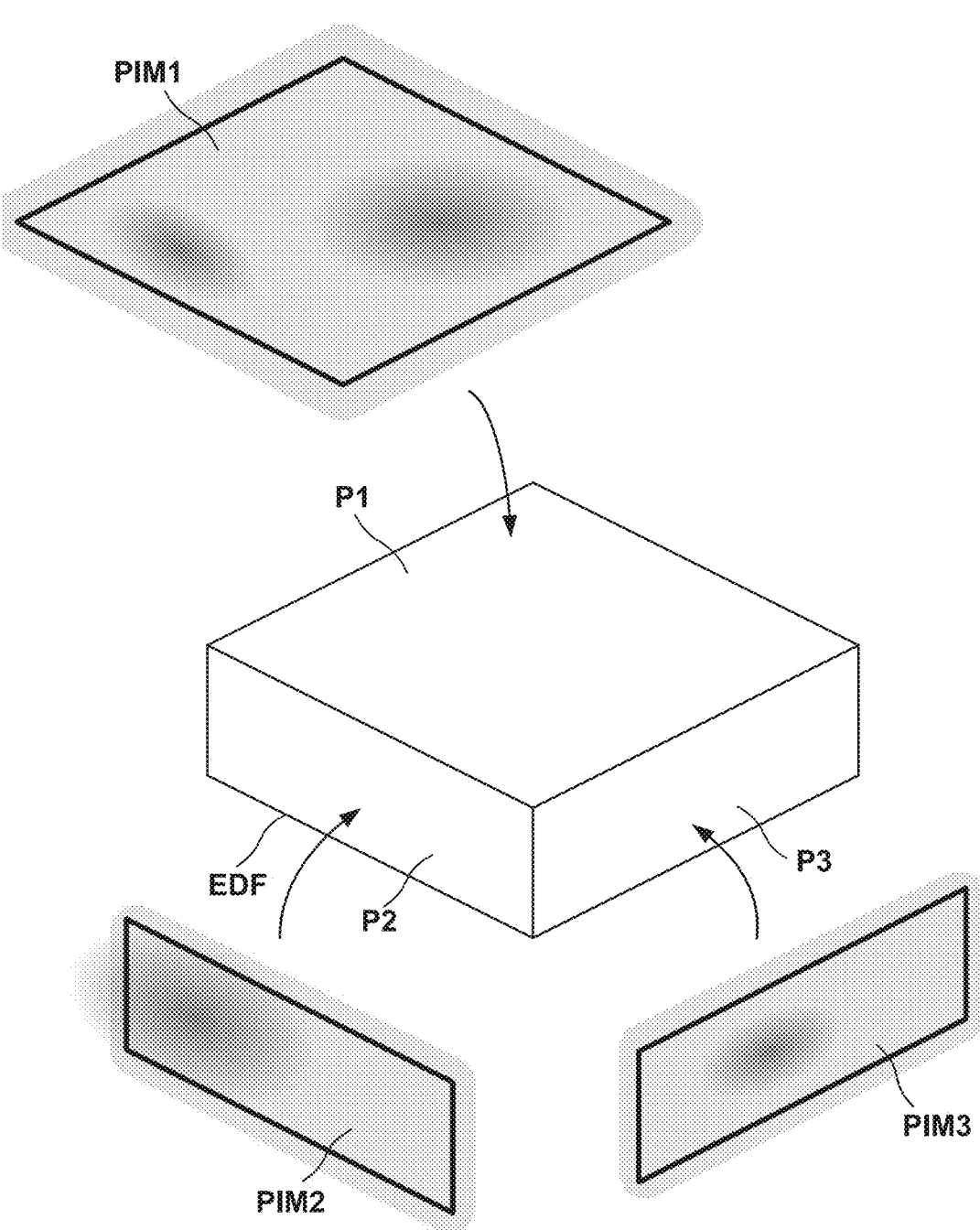

F I G. 11
220
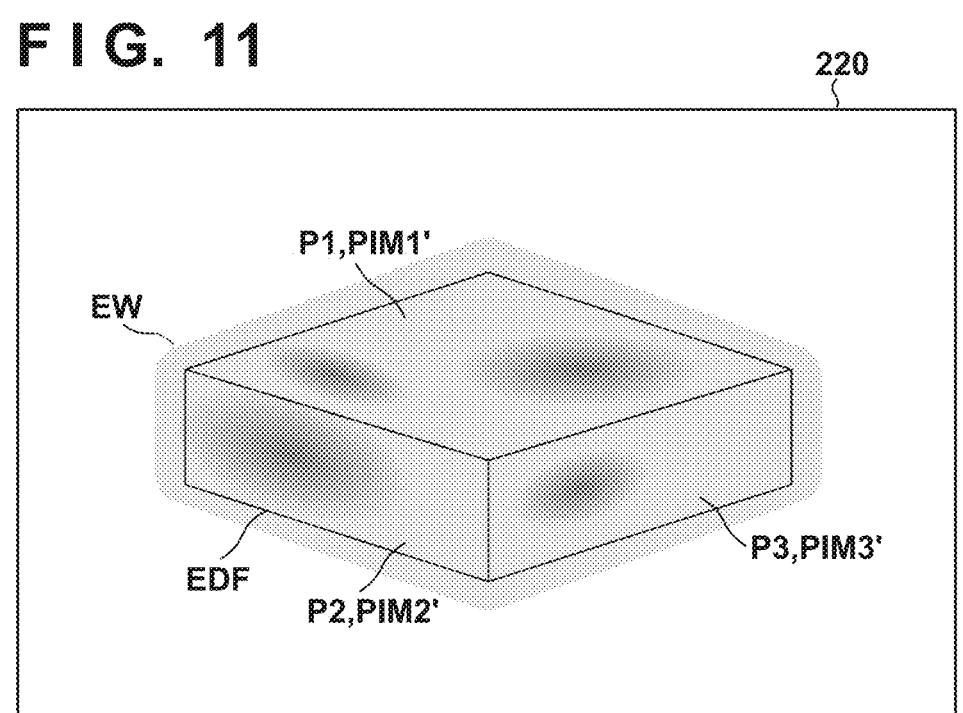
F I G. 12
110,220
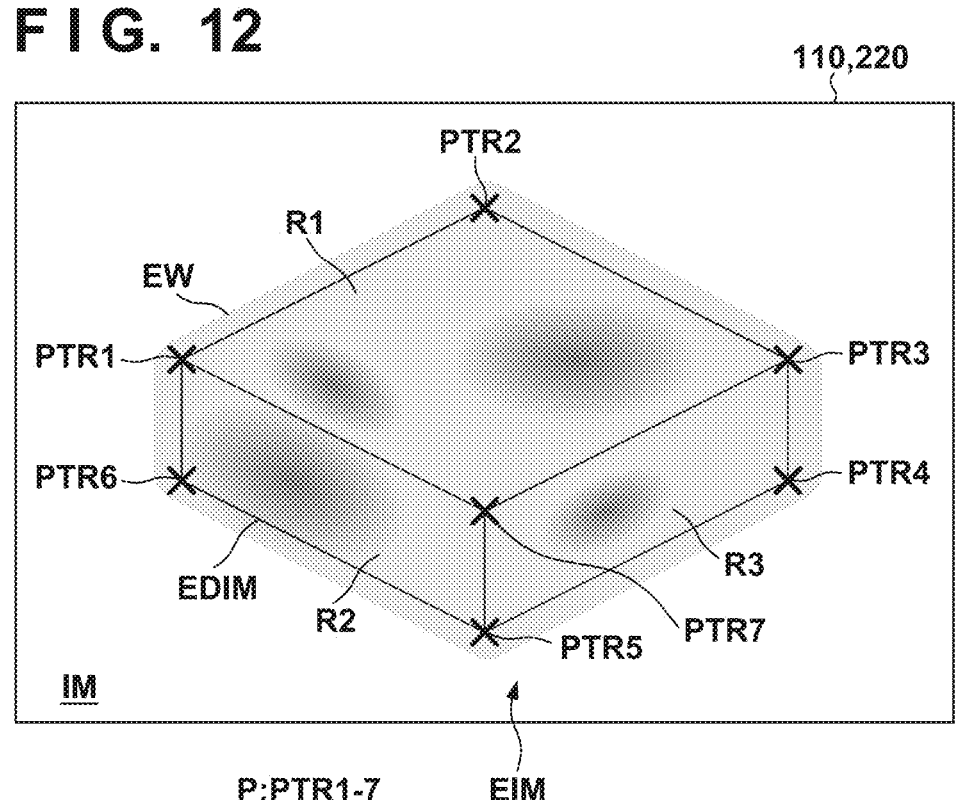
P:PTR1-7          EIM

F I G. 13
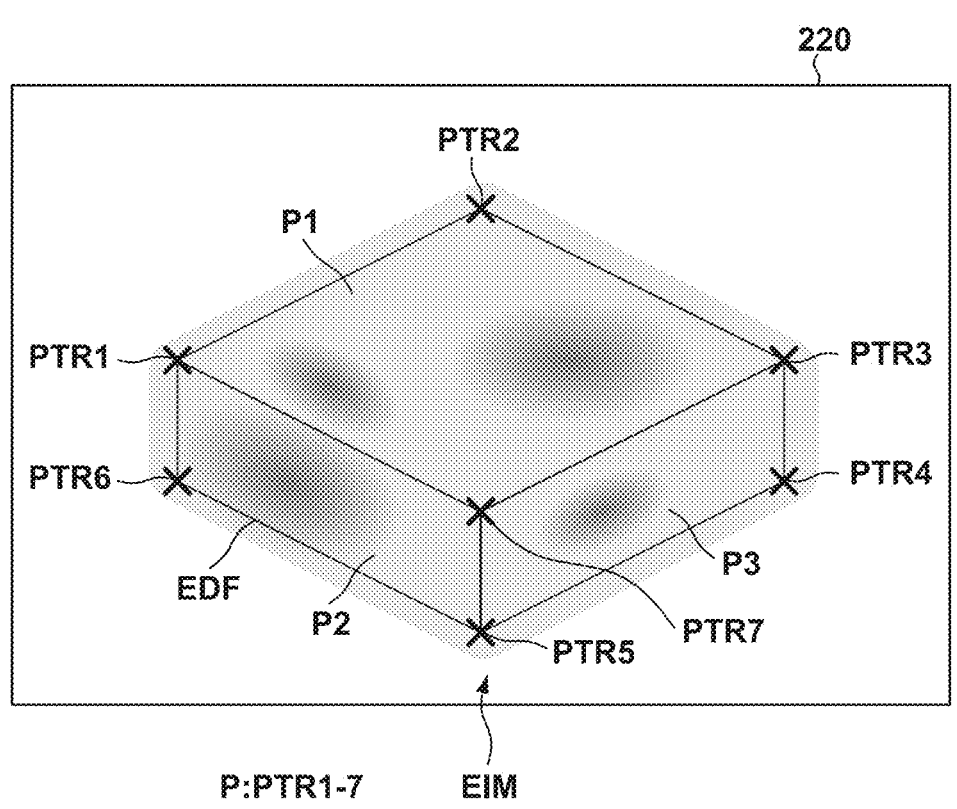

SUPPORT APPARATUS, DESIGN SUPPORT METHOD, AND NON-TRANSITORY COMPUTER READABLE MEDIUM STORING A COMPUTER PROGRAM

CROSS-REFERENCE TO RELATED APPLICATION(S)

This application is a continuation of International Patent Application No. PCT/JP2020/014225 filed on Mar. 27, 2020, the entire disclosures of which is incorporated herein by reference.

TECHNICAL FIELD

The present invention relates to a design support apparatus, a design support method, and non-transitory computer readable medium storing a computer program.

BACKGROUND ART

An electromagnetic wave radiated from an electronic device may cause an operation error of the electronic device or another electronic device or affect a human body. Hence, the electronic device is required to satisfy the EMC standard. After an electronic device is designed based on experiences, simulations, and the like such that the EMC standard is satisfied, a prototype thereof is produced, and tests are then conducted. If an error that does not satisfy the EMC standard occurs in the tests, it needs to be fed back to the design.

The present applicant has not recognized any prior art literature concerning a design support tool configured to feed back an error as described above to the design of an electronic device.

SUMMARY OF INVENTION

The present invention provides a technique advantageous for feeding back the measurement result of an electromagnetic wave radiated from an electronic device to the design of the electronic device.

A first aspect of the present invention is directed to a design support apparatus, and the design support apparatus comprises an acquisition unit configured to acquire an electromagnetic wave image in which a captured image obtained by capturing an electronic device and a map obtained by mapping, in a two-dimensional space, a measurement result of an electromagnetic wave radiated from the electronic device are superimposed; and a composition unit configured to cause a display unit to display a CAD drawing representing a shape of the electronic device and the electromagnetic wave image in a superimposed manner such that the CAD drawing and a device image that is an image of the electronic device in the captured image are aligned.

A second aspect of the present invention is directed to a design support method, and the design support method comprises a step of acquiring an electromagnetic wave image in which a captured image obtained by capturing an electronic device and a map obtained by mapping, in a two-dimensional space, an electromagnetic wave radiated from the electronic device are superimposed; and a composition step of causing a display unit to display a CAD drawing representing a shape of the electronic device and the electromagnetic wave image in a superimposed manner such that the CAD drawing and a device image that is an image of the electronic device in the captured image are aligned.

A third aspect of the present invention is directed to a non-transitory computer readable medium storing a computer program configured to cause a computer to operate as the design support apparatus according to the first aspect.

BRIEF DESCRIPTION OF DRAWINGS

FIG. 1 is a block diagram showing the configuration of a design support apparatus according to the embodiment;

FIG. 2 is a view schematically showing an example of an operation of measuring, by a measurement device, an electromagnetic wave radiated from an electronic device;

FIG. 3 is a view schematically showing an example of an image displayed on the display unit of the measurement device when the operation of measuring, by the measurement device, the electromagnetic wave radiated from the electronic device is being executed;

FIG. 4 is a flowchart exemplarily showing the operation of the design support apparatus;

FIG. 10 is a view schematically showing an example of the operation of the composition unit;

FIG. 11 is a view schematically showing an effect provided by the operation of the composition unit described with reference to FIG. 10;

FIG. 12 is a view schematically showing an example in which a plurality of pointers configured to specify each of the contours of a plurality of regions of a device image that is the image of the electronic device that can be regarded as a three-dimensional structure are set;

FIG. 13 is a view schematically showing a result of displaying, by the composition unit of the CAD device, a CAD drawing representing the shape of the electronic device and an electromagnetic wave image in a superimposed manner on the display screen of the display unit.

DESCRIPTION OF EMBODIMENTS

Figure 5:
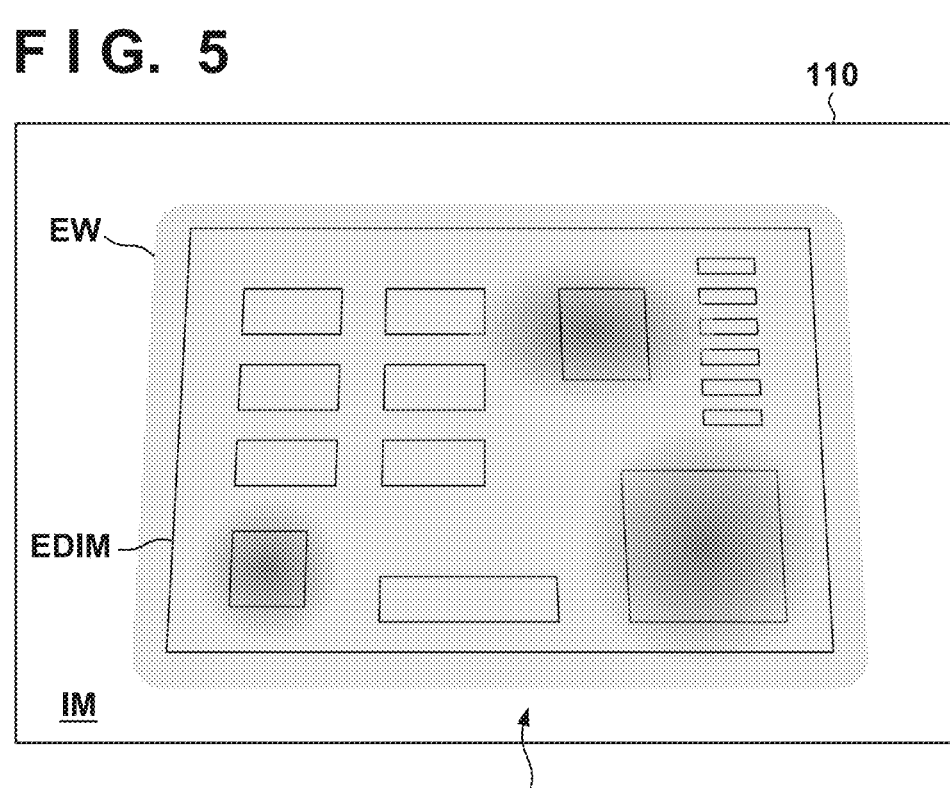
FIG. 5 is a view exemplarily showing a captured image displayed on the display unit of the measurement device and the measurement result of an electromagnetic wave by the measurement device.

Hereinafter, embodiments will be described in detail with reference to the attached drawings. Note, the following embodiments are not intended to limit the scope of the claimed invention, and limitation is not made to an invention that requires a combination of all features described in the embodiments. Two or more of the multiple features described in the embodiments may be combined as appropriate. Furthermore, the same reference numerals are given to the same or similar configurations, and redundant description thereof is omitted.

FIG. 1 shows the configuration of a design support apparatus 1 according to the embodiment. The design support apparatus 1 can include, for example, a measurement device 100 and a CAD device 200. The design support apparatus 1 may have, for example, a configuration in which the measurement device 100 and the CAD device 200 are integrated, or may be configured to include the measurement device 100 and the CAD device 200 as separate devices. Even the design support apparatus 1 having the configuration in which the measurement device 100 and the CAD device 200 are integrated can be understood as an apparatus including the measurement device 100 and the CAD device 200.

The measurement device 100 can include, for example, an image capturing unit 102, an electromagnetic wave measurement unit 104, an electromagnetic wave image generation unit 106, a setting unit 108, a display unit 110, and an input/output unit 112. The image capturing unit 102 can generate a captured image by capturing an electronic device. The electromagnetic wave measurement unit 104 can measure an electromagnetic wave radiated from the electronic device. The electromagnetic wave image generation unit 106 can generate an electromagnetic wave image in which the captured image obtained by the image capturing unit 102 capturing the electronic device and a map obtained by mapping, in a two-dimensional space, the measurement result of the electromagnetic wave by the electromagnetic wave measurement unit 104 are superimposed. The setting unit 108 can specify the region of a device image that is the image of the electronic device in the captured image. The setting unit 108 can, for example, extract the contour of the device image that is the image of the electronic device in the captured image. Alternatively, the setting unit 108 can set a plurality of pointers for the electromagnetic wave image. Here, the plurality of pointers can be set to specify the region of the device image that is the image of the electronic device in the captured image.

The display unit 110 and the input/output unit 112 can form a user interface. The captured image obtained by the image capturing unit 102 capturing the electronic device, the map obtained by mapping, in a two-dimensional space, the measurement result of the electromagnetic wave by the electromagnetic wave measurement unit 104, the electromagnetic wave image, and the like can be displayed on the display screen of the display unit 110. The input/output unit 112 can include, for example, all or some of a plurality of input/output devices such as a keyboard, a mouse, a touch pad, a communication unit, and a media drive. The measurement device 100 can be formed by installing software (computer program) in a dedicated or general-purpose computer with an image capturing function and adding the electromagnetic wave measurement unit 104. The electromagnetic wave measurement unit 104 can include a detector (a detector DET to be described later) configured to detect an electromagnetic wave, and a driver configured to drive the detector. Part of the driver can be software installed in the computer that can form the measurement device 100.

The CAD device 200 can be formed by installing software (computer program) in a dedicated or general-purpose computer. The CAD device 200 can include, for example, a CAD tool 210, a display unit 220, and an input/output unit 230.

The CAD tool 210 can be software installed in the computer that can form the CAD device 200. The display unit 220 and the input/output unit 230 can form a user interface.

The CAD tool 210 can include, for example, a composition unit 212, a 3D image generation unit 214, and an editing unit 216. The composition unit 212 can generate a composite image in which a CAD drawing that can be generated by the CAD tool 210 and an electromagnetic wave image provided from the measurement device 100 are superimposed. The CAD drawing is data representing the shape of an electronic device. Superimposition of the CAD drawing and the electromagnetic wave image can be executed such that the CAD drawing and the device image that is the image (an image of a portion of the electronic device in the captured image) of the electronic device in the captured image captured by the image capturing unit 102 of the measurement device 100 and provided to the CAD device 200 are aligned.

The 3D image generation unit 214 can generate a 3D version of the CAD drawing in accordance with a designated viewpoint. The editing unit 216 can provide, to the user, a function for editing or designing an electronic device ED. The editing unit 216 can provide, for example, a function for editing or designing one or a plurality of electronic components such as printed boards and housings for storing these.

The electromagnetic wave image generated by the electromagnetic wave image generation unit 106 of the measurement device 100 can be provided from the measurement device 100 to the CAD device 200 via the input/output unit 112 of the measurement device 100 and the input/output unit 230 of the CAD device 200. This providing may be done by, for example, a form of communication between the input/output unit 112 and the input/output unit 230, may be done via a memory medium, or may be done in another form. In one aspect, the input/output unit 230 of the CAD device 200 can form an acquisition unit configured to acquire an electromagnetic wave image from the measurement device 100. In another aspect, the electromagnetic wave image generation unit 106 and the input/output unit 112 of the measurement device 100 and the input/output unit 230 of the CAD device 200 can form an acquisition unit configured to acquire an electromagnetic wave image. In still another aspect, the image capturing unit 102, the electromagnetic wave measurement unit 104, the electromagnetic wave image generation unit 106, and the input/output unit 112 of the measurement device 100 and the input/output unit 230 of the CAD device 200 can form an acquisition unit configured to acquire an electromagnetic wave image.

In a case where the measurement device 100 and the CAD device 200 are separate, the whole or a part of the electromagnetic wave image generation unit 106 may be provided in the CAD device 200, and the whole or a part of the setting unit 108 may be provided in the CAD device 200.

FIG. 2 schematically shows an example of an operation of measuring, by the measurement device 100, an electromagnetic wave radiated from the electronic device ED. FIG. 3 schematically shows an example of an image displayed on the display unit 110 when the operation of measuring, by the measurement device 100, the electromagnetic wave radiated from the electronic device ED is being executed. The electronic device ED is captured by the image capturing unit 102, and a captured image IM captured by the image capturing unit 102 is displayed on the display unit 110. The captured image IM includes a device image EDIM that is the image of the electronic device ED. The electromagnetic wave measurement unit 104 can include, for example, the detector DET that can be moved along the surface of the electronic device ED by a moving mechanism (not shown)

or the user. The captured image IM can include an image DETIM of the electromagnetic wave measurement unit 104. The electromagnetic wave measurement unit IM can detect the position of the detector DET (in other words, the relative position of the detector DET with respect to the electronic device ED) in the captured image IM by, for example, identifying the image DETIM of the detector DET in the captured image IM. The detector DET can detect the electromagnetic wave radiated from the electronic device ED. The electromagnetic wave measurement unit 104 can thus generate a map in which the intensity of the electromagnetic wave detected by the detector DET is mapped in the visual field of the image capturing unit 102 (or the captured image IM), that is, in the two-dimensional space. The electromagnetic wave image generation unit 106 can generate an electromagnetic wave image in which the captured image IM obtained by the image capturing unit 102 capturing the electronic device ED (typically, a captured image that does not include the image DETIM of the detector DET) and the map obtained by mapping, in the two-dimensional space, the result (measurement result) of detecting, by the detector DET, the electromagnetic wave radiated from the electronic device ED are superimposed, and provide the electromagnetic wave image to the CAD device 200 via the input/output unit 112. Thus, the CAD device 200 can acquire the electromagnetic wave image.

FIG. 4 exemplarily shows the operation of the design support apparatus 1. In step S402, the CAD device 200 can transfer measurement specifications to the measurement device 100. The measurement specifications are specifications for measurement executed using the measurement device 100, and can instruct, for example, the direction of the electronic device ED, in which the image capturing unit 102 of the measurement device 100 is arranged to measure the electromagnetic wave radiated from the electronic device ED. Here, a reference can be presented to show the direction of the electronic device ED, in which the image capturing unit 102 is arranged to execute measurement. For example, if the electronic device ED can be regarded as a two-dimensional structure like a printed wiring board, a reference for indicating a predetermined position on the obverse surface of the two-dimensional structure can be provided. The reference can be a notch, a mark, a character, or the like. In an example, the two-dimensional structure is provided with a reference indicating a predetermined corner portion (for example, the upper left corner) of the obverse surface.

If the electronic device ED is a three-dimensional structure like a rectangular parallelepiped, for example, references can be provided such that a surface facing a support surface that supports the electronic device ED in measurement is set to a first reference surface, and a side surface of the electronic device ED is set to a second reference surface. In this case, the references indicating the first reference surface and the second reference surface can each be represented by a notch, a mark, a character, or the like. In an example, the first reference surface can be a surface (bottom surface) observed as a bottom view, and the second reference surface can be a surface (front surface) observed as a front view. By specifying the first reference surface (bottom surface) and the second reference surface (front surface), the remaining surfaces (the left side surface, the right side surface, the rear surface, and the upper surface) can be specified.

To indicate the direction of the electronic device ED, in which the image capturing unit 102 of the measurement device 100 is arranged to execute measurement, the measurement specifications may include a drawing (for example, a CAD drawing or an illustration) or photo expressing the electronic device ED. The measurement can be executed by arranging the image capturing unit 102 of the measurement device 100 at a position where the electronic device ED can be observed from the same angle as the drawing or photo.

In step S404, the measurement device 100 can display, on the display unit 110, the measurement specifications transferred from the CAD device 200 in step S402. The user can prepare for measurement (for example, arrange the electronic device ED and the measurement device 100) in accordance with the measurement specifications. In step S406, the measurement device 100 waits until the measurement preparation is completed. If the measurement preparation is completed, the process can advance to step S408. The measurement preparation can be judged to be completed if information for notifying that is input to the input/output unit 112.

In step S408, the measurement device 100 can capture, by the image capturing unit 102, the electronic device ED to generate the captured image IM. The captured image IM can be displayed on the display screen of the display unit 110. In step S410, the measurement device 100 detects (that is, measures), by the detector DET, the intensity of the electromagnetic wave radiated from the electronic device ED in correspondence with a position in the two-dimensional space (the visual field of the image capturing unit 102) by the electromagnetic wave measurement unit 104. Accordingly, a map in which the measurement result of the electromagnetic wave radiated from the electronic device ED is mapped in the two-dimensional space can be obtained. In step S412, the measurement device 100 can generate, by the electromagnetic wave image generation unit 106, an electromagnetic wave image EIM in which the captured image IM captured in step S408 and the map obtained using the detector DET in step S410 are superimposed.

In step S414, for example, the measurement device 100 can extract the contour of the device image EDIM and set information representing the contour as additional information by the setting unit 108. In this case, the composition unit 212 of the CAD device 200 can recognize the region of the device image EDIM based on the additional information representing the contour. Alternatively, in step S414, the measurement device 100 may set a plurality of pointers as additional information to the electromagnetic wave image EIM by the setting unit 108. The plurality of pointers can be used to specify the region of the device image EDIM that is the image of the electronic device ED in the captured image IM. If the electronic device ED of the measurement target is handled as a two-dimensional structure, the plurality of pointers can be, for example, four pointers. If the electronic device ED of the measurement target is handled as a three-dimensional structure, and three surface thereof are simultaneously observed, the plurality of pointers can be seven pointers. However, the number of pointers can freely be set in accordance with the measurement specifications.

If the composition unit 212 of the CAD device 200 needs no additional information, step S414 need not be executed in the measurement device 100. For example, if the composition unit 212 of the CAD device 200 has a function of extracting the contour of the device image EDIM, that is, if the composition unit 212 has a function of specifying the region of the device image EDIM in the captured image IM, step S414 need not be executed by the measurement device 100. Alternatively, if the composition unit 212 of the CAD device 200 has a function of setting a plurality of pointers, step S414 need not be executed by the measurement device 100. Expressing from another viewpoint, if a function corresponding to the setting unit 108 is provided in the CAD device 200, step S414 can be executed by the composition unit 212 of the CAD device 200 after step S416.

In step S416, the measurement device 100 can transfer, by the input/output unit 112, the electromagnetic wave image IM generated in step S412 to the CAD device 200. Here, if step S418 is executed, additional information can also be transferred to the CAD device 200 by the input/output unit 112 in step S415.

In step S418, the CAD device 200 can cause the display unit 220 to display the CAD drawing and the electromagnetic wave image in a superimposed manner on the display screen of the display unit 220 such that a CAD drawing representing the shape of the electronic device ED and the device image EDIM that is the image of the electronic device ED in the captured image IM are aligned by the composition unit 212. Alignment between the CAD drawing and the captured image IM can include performing at least one of deformation, movement, and rotation for at least one of the CAD drawing and the captured image IM. The composition unit 212 can, for example, extract a first reference (for example, a mark such as a logo, a vertex, or a corner) for alignment from the electromagnetic wave image and perform alignment between the CAD drawing and the captured image IM such that the first reference and a second reference (for example, a reference corresponding to the first reference) provided on the electronic device ED overlap. The user can feed back the measurement result of the electromagnetic wave radiated from the electronic device ED to the design of the electronic device ED by the image displayed on the display screen of the display unit 220.

Figure 6:
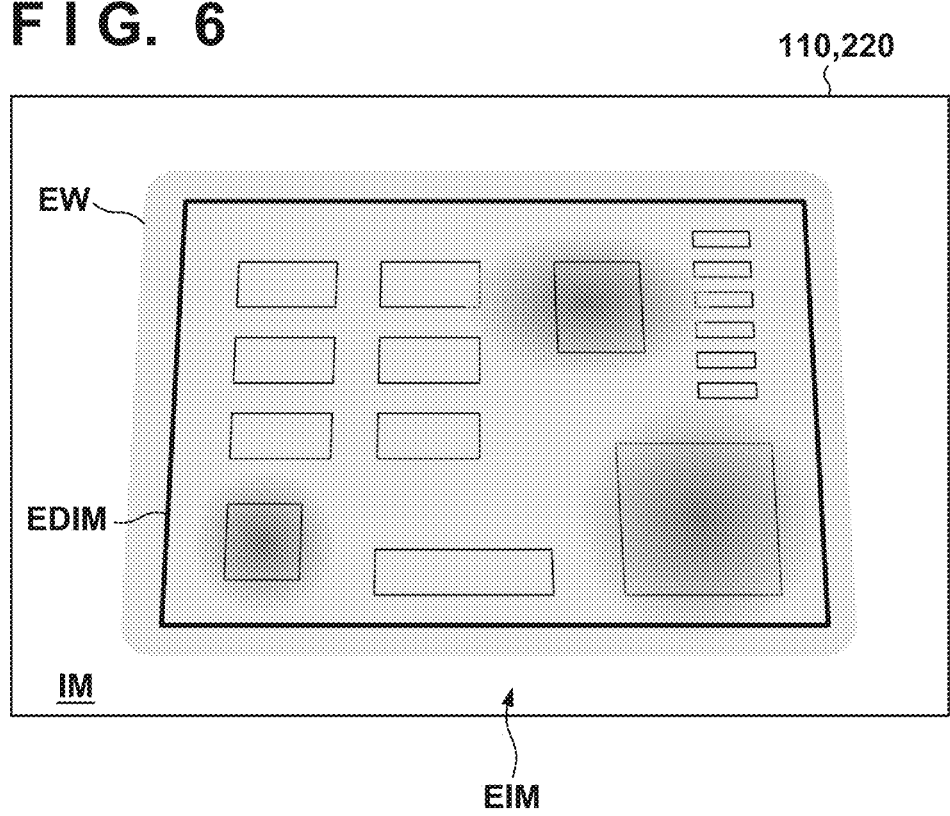
FIG. 6 is a view schematically showing a result of extracting the contour of a device image that is the image of the electronic device that can be regarded as a two-dimensional structure.

FIG. 5 exemplarily shows the captured image IM displayed on the display screen of the display unit 110 of the measurement device 100 and a measurement result EW of the electromagnetic wave by the measurement device 100. The captured image IM includes the device image EDIM that is the image of the electronic device EM. The measurement result EW (for example, the intensity distribution) of the electromagnetic wave can be expressed in tones. In the example shown in FIG. 5, a higher density represents a higher intensity. FIG. 6 schematically shows a result of extracting, by the setting unit 108 of the measurement device 100 or the composition unit 212 of the CAD device 200, the contour of the device image EDIM that is the image of the electronic device ED that can be regarded as a two-dimensional structure. The contour is indicated by a thick line in FIG. 6. The contour of the device image EDIM extracted by the setting unit 108 of the measurement device 100 can be superimposed on the device image EDIM and displayed on the display screen of the display unit 110. The contour of the device image EDIM extracted by the composition unit 212 of the CAD device 200 can be superimposed on the device image EDIM and displayed on the display screen of the display unit 220.

Figure 7:
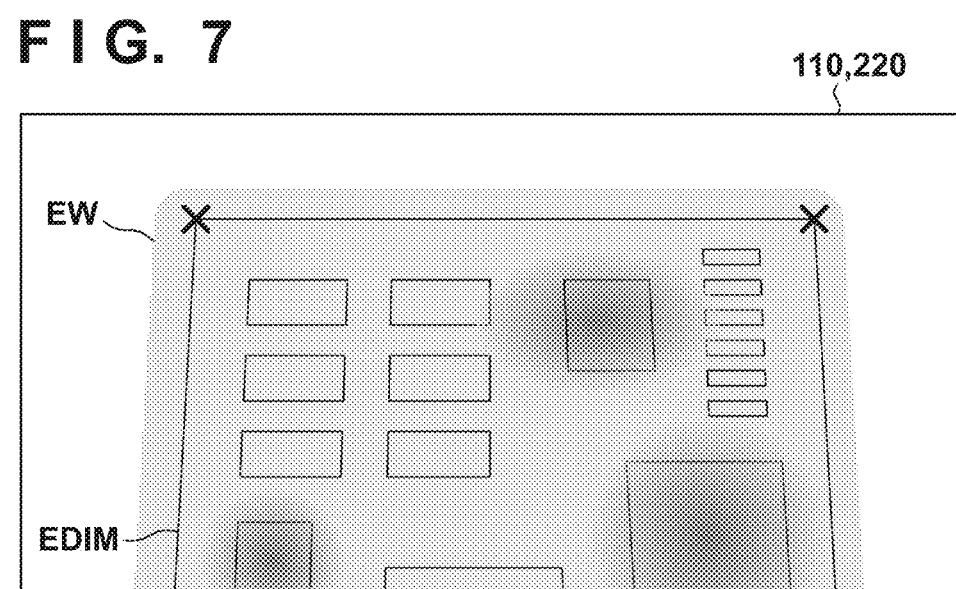
FIG. 7 is a view schematically showing an example in which a plurality of pointers indicating the region of the device image that is the image of the electronic device that can be regarded as a two-dimensional structure are set.

FIG. 7 schematically shows an example in which a plurality of pointers indicating the region of the device image EDIM that is the image of the electronic device ED that can be regarded as a two-dimensional structure are set by the setting unit 108 of the measurement device 100 or the composition unit 212 of the CAD device 200. In the example shown in FIG. 7, the pointer P is expressed by an X mark. The pointers P may be set by the user via a user interface formed by, for example, the display unit 110 and the input/output unit 112. Alternatively, the pointers P may automatically be set by the setting unit 108 or the composition unit 212 in accordance with the measurement specifications (predetermined rules). The measurement specifications can decide the plurality of pointers P to indicate, for example, the outer shape of the device image EDIM. Alternatively, if the electronic device ED has a rectangular shape, the measurement specifications can decide the plurality of pointers P to decide the plurality of pointers to specify the vertices of the rectangular shape.

The pointers P may be determined by causing the user to confirm temporary pointers automatically generated by the setting unit 108 or the composition unit 212 and changing or adjusting these as needed. To promote the user to set the pointers P, the setting unit 108 or the composition unit 212 can promote the user to set the pointers P in accordance with the measurement specifications. For example, the setting unit 108 or the composition unit 212 can display a message on the display screen of the display unit 110 to sequentially set a pointer indicating the upper left corner or vertex of the electronic device ED, a pointer indicating the upper right corner or vertex, a pointer indicating the lower right corner or vertex, and a pointer indicating the lower left corner or vertex. In response to the message, the user can input the coordinates of the pointers using the input/output unit 112 or the input/output unit 230 (for example, a mouse). The pointers P set by the setting unit 108 of the measurement device 100 can be superimposed on the device image EDIM and displayed on the display screen of the display unit 110. The pointers P set by the composition unit 212 of the CAD device 200 can be superimposed on the device image EDIM and displayed on the display screen of the display unit 220.

Figure 8:
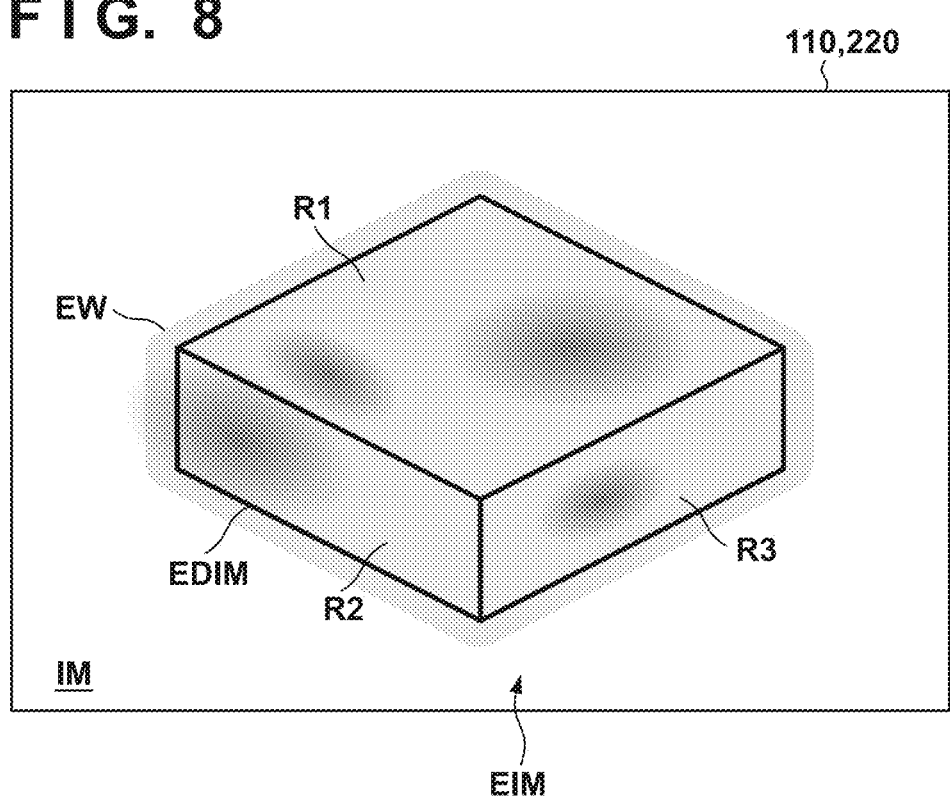
FIG. 8 is a view schematically showing a result of extracting the contours of a plurality of regions of the device image that is the image of the electronic device that can be regarded as a three-dimensional structure.

FIG. 8 schematically shows a result of extracting, by the setting unit 108 of the measurement device 100 or the composition unit 212 of the CAD device 200, the contours of a plurality of regions of the device image EDIM that is the image of the electronic device EM that can be regarded as a three-dimensional structure. The contours are indicated by thick lines in FIG. 8. The device image EDIM includes a plurality of regions R1, R2, and R3 corresponding to a plurality of surfaces of the electronic device ED, respectively, and the setting unit 108 or the composition unit 212 can extract the contour of each of the plurality of regions R1. R2, and R3. The contours of the plurality of regions R1, R2, and R3 of the device image EDIM extracted by the setting unit 108 of the measurement device 100 can be superimposed on the device image EDIM and displayed on the display screen of the display unit 110. The contours of the plurality of regions R1, R2, and R3 of the device image EDIM extracted by the composition unit 212 of the CAD device 200 can be superimposed on the device image EDIM and displayed on the display screen of the display unit 220.

Figure 9:
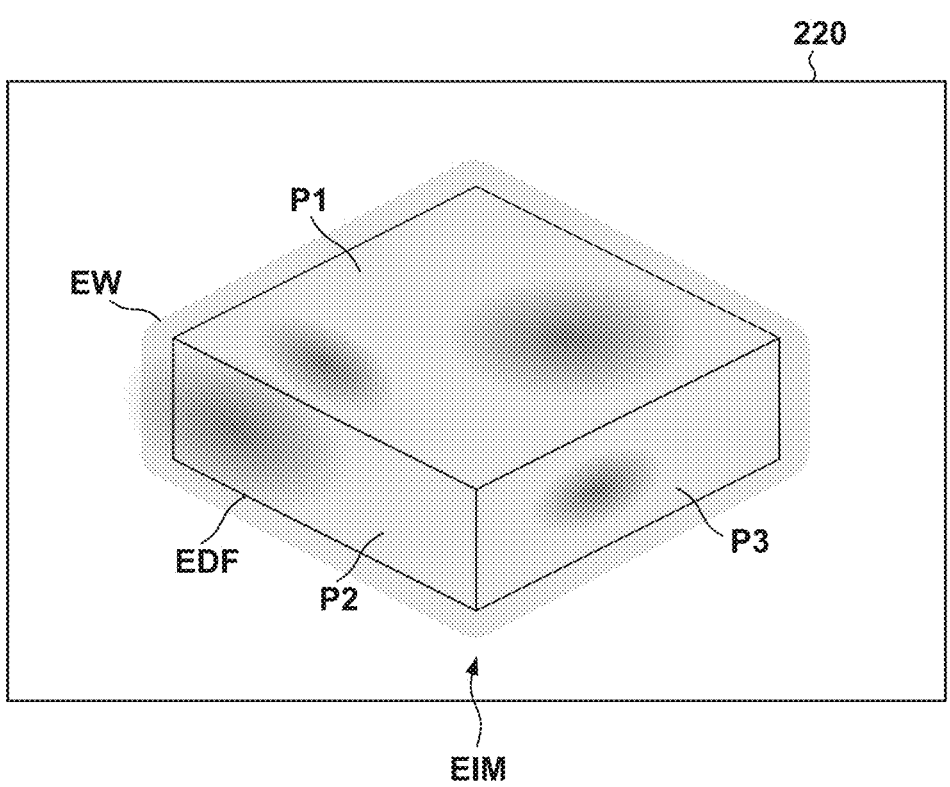
FIG. 9 is a view schematically showing a result of displaying, by the composition unit of a CAD device, a CAD drawing representing the shape of the electronic device and an electromagnetic wave image in a superimposed manner on the display screen of the display unit.

FIG. 9 schematically shows a result of displaying, by the composition unit 212 of the CAD device 200, a CAD drawing EDF representing the shape of the electronic device ED and the electromagnetic wave image EIM in a superimposed manner on the display screen of the display unit 220. The CAD drawing EDF can include a plurality of portions P1, P2, and P3 corresponding to the plurality of surfaces of the electronic device ED, respectively. When superimposing the CAD drawing EDF and the electromagnetic wave image EIM, the composition unit 212 can align each of the plurality of portions P1, P2, and P3 of the CAD drawing ED and a corresponding one of the plurality of regions R1, R2, and R3 based on the contour of each of the plurality of regions R1, R2, and R3.

FIG. 10 schematically shows an example of the operation of the composition unit 212. The composition unit 212 can extract, from the electromagnetic wave image EIM, a plurality of partial images PIM1, PIM2, and PIM3 corresponding to the plurality of regions R1, R2, and R3 in the device image EDIM, respectively, based on the above-described contours, and paste each of the plurality of partial images PIM to a corresponding one of the plurality of portions P1, P2, and P3. This function can be useful to superimpose, on each of the plurality of portions P1, P2, and P3 in the 3D version of the CAD drawing EDF generated by the 3D image generation unit 214 in accordance with a viewpoint that can arbitrarily be designated, a corresponding one of converted images PIM1', PIM2', and PIM3' obtained by converting a corresponding one of the plurality of partial images PIM1, PIM2, and PIM3 in accordance with the viewpoint and display these on the display screen of the display unit 220, as shown in FIG. 11.

FIG. 12 schematically shows an example in which the plurality of pointers P configured to specify each of the plurality of regions of the device image EDIM that is the image of the electronic device EM that can be regarded as a three-dimensional structure are set by the setting unit 108 of the measurement device 100 or the composition unit 212 of the CAD device 200. In the example shown in FIG. 12, the pointer P is expressed by an X mark. The pointers P may be set by the user via a user interface formed by, for example, the display unit 110 and the input/output unit 112. Alternatively, the pointers P may automatically be set by the setting unit 108 or the composition unit 212 in accordance with the measurement specifications (predetermined rules). The measurement specifications decide the plurality of pointers P to specify, for example, the plurality of regions R1, R2, and R3 in the device image EDIM corresponding to the plurality of surfaces of the electronic device ED.

The pointers P may be determined by causing the user to confirm temporary pointers automatically generated by the setting unit 108 or the composition unit 212 and changing or adjusting these as needed. To promote the user to set the pointers P, the setting unit 108 or the composition unit 212 can promote the user to set the pointers P in accordance with the measurement specifications. For example, if the device image EDIM includes three surfaces, the setting unit 108 or the composition unit 212 can display a message on the display screen of the display unit 110 to sequentially set seven pointers P, that is, pointers PTR1 to PTR7. Each of the three regions R1, R2, and R3 in the device image EDIM can be specified by four pointers. In response to the message, the user can input the coordinates of the pointers using the input/output unit 112 or the input/output unit 230 (for example, a mouse). The pointers P set by the setting unit 108 of the measurement device 100 can be superimposed on the device image EDIM and displayed on the display screen of the display unit 110. The pointers P set by the composition unit 212 of the CAD device 200 can be superimposed on the device image EDIM and displayed on the display screen of the display unit 220.

FIG. 13 schematically shows a result of displaying, by the composition unit 212 of the CAD device 200, the CAD drawing EDF representing the shape of the electronic device ED and the electromagnetic wave image EIM in a superimposed manner on the display screen of the display unit 220. The CAD drawing EDF can include the plurality of portions P1, P2, and P3 corresponding to the plurality of surfaces of the electronic device ED, respectively. When superimposing the CAD drawing EDF and the electromagnetic wave image EIM, the composition unit 212 can align each of the plurality of portions P1, P2, and P3 of the CAD drawing ED and a corresponding one of the plurality of regions R1, R2, and R3 of the device image EDIM based on the plurality of pointersP (PTR1 to PTR7).

Figure 14:
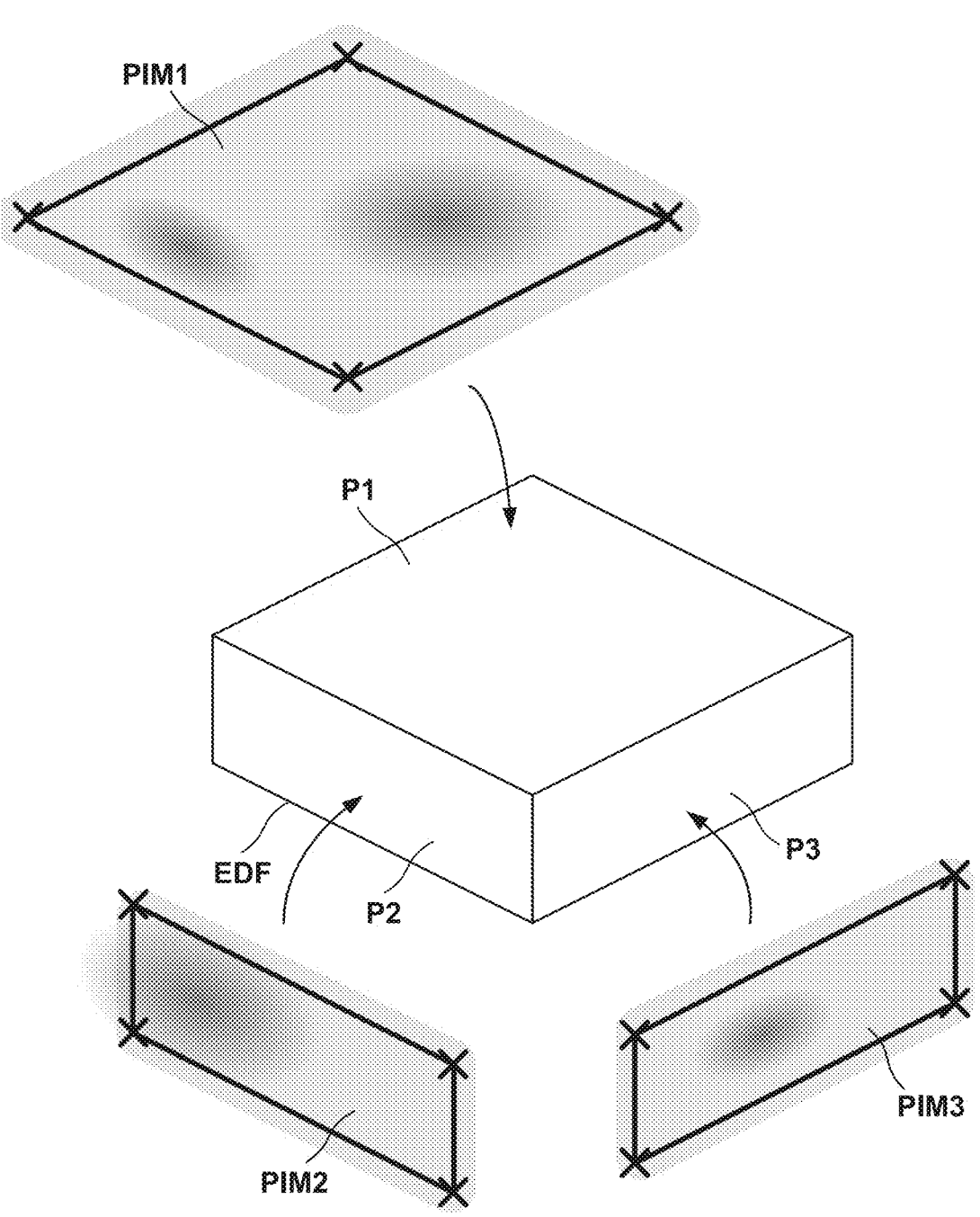
FIG. 14 is a view schematically showing an example of the operation of the composition unit.

FIG. 14 schematically shows an example of the operation of the composition unit 212. The composition unit 212 can extract, from the electromagnetic wave image, the plurality of partial images PIM1, PIM2, and PIM3 corresponding to the plurality of regions R1, R2, and R3 in the device image EDIM, respectively, based on the plurality of pointersP (PTR1 to PTR7), and paste each of the plurality of partial images PIM1, PIM2, and PIM3 to a corresponding one of the plurality of portions P1, P2, and P3. This function can be useful to superimpose, on each of the plurality of portions P1, P2, and P3 in the 3D version of the CAD drawing EDF generated by the 3D image generation unit 214 in accordance with a viewpoint that can arbitrarily be designated, a corresponding one of the converted images PIM1'. PIM2', and PIM3' obtained by converting a corresponding one of the plurality of partial images PIM1, PIM2, and PIM3 in accordance with the viewpoint and display these on the display screen of the display unit 220, as shown in FIG. 11.

The invention is not limited to the foregoing embodiments, and various variations/changes are possible within the spirit of the invention.

REFERENCE SIGNS LIST

1: design support apparatus, ED: electronic device, DET: detector, DETIM: image of detector, EDIM: device image, EW: measurement result of electromagnetic wave, EIM: electromagnetic wave image, IM: captured image, P: pointer, R1, R2, R3: region in device image, EDF: CAD drawing, P1, P2, P3: portion in CAD drawing, 110, 220: display unit

The invention claimed is:

1. A design support apparatus comprising:
an acquisition unit configured to acquire an electromagnetic wave image in which a captured image obtained by capturing an electronic device and a map obtained by mapping, in a two-dimensional space, a measurement result of an electromagnetic wave radiated from the electronic device are superimposed;
a composition unit configured to cause a display unit to display a CAD drawing representing a shape of the electronic device and the electromagnetic wave image in a superimposed manner such that the CAD drawing and a device image that is an image of the electronic device in the captured image are aligned,
wherein the composition unit aligns the CAD drawing and the device image based on a plurality of pointers representing a region of the device image; and
a setting unit configured to set the plurality of pointers automatically for the electromagnetic wave image in accordance with a predetermined rule for decision making.

2. The design support apparatus according to claim 1, wherein the composition unit aligns the CAD drawing and the device image based on a contour of the device image.

3. The design support apparatus according to claim 2, wherein
the CAD drawing includes a plurality of portions corresponding to a plurality of surfaces of the electronic device, respectively,
the device image includes a plurality of regions corresponding to the plurality of surfaces, respectively, and

the composition unit aligns each of the plurality of portions and a corresponding one of the plurality of regions based on the contour of each of the plurality of regions.

4. The design support apparatus according to claim 3, wherein the composition unit extracts, from the electromagnetic wave image, a plurality of partial images corresponding to the plurality of regions in the device image, respectively, and pastes each of the plurality of partial images to a corresponding one of the plurality of portions.

5. The design support apparatus according to claim 4, further comprising a 3D image generation unit configured to generate a 3D version of the CAD drawing in accordance with a designated viewpoint, wherein the composition unit causes the display unit to superimpose and display, on each of the plurality of portions in the 3D version, a converted image obtained by converting a corresponding one of the plurality of partial images in accordance with the viewpoint.

6. The design support apparatus according to claim 2, wherein the acquisition unit acquires, for each of a plurality of surfaces of the electronic device, the electromagnetic wave image in which the captured image obtained by capturing the electronic device and the map obtained by mapping, in the two-dimensional space, the measurement result of the electromagnetic wave radiated from the electronic device are superimposed, the CAD drawing includes a plurality of portions corresponding to the plurality of surfaces of the electronic device, respectively, and the composition unit aligns, for each of the plurality of portions, the portion and the device image based on the contour of the device image corresponding to the portion.

7. The design support apparatus according to claim 1, wherein the rule decides the plurality of pointers to indicate an outer shape of the device image.

8. The design support apparatus according to claim 1, wherein the electronic device has a rectangular shape, and the rule decides the plurality of pointers to specify vertices of the rectangular shape.

9. The design support apparatus according to claim 1, wherein the rule decides the plurality of pointers to specify a plurality of regions in the device image, which correspond to a plurality of surfaces of the electronic device, respectively.

10. The design support apparatus according to claim 9, wherein the rule decides the plurality of pointers to specify vertices that specify the plurality of regions.

11. The design support apparatus according to claim 9, wherein the CAD drawing includes a plurality of portions corresponding to a plurality of surfaces of the electronic device, respectively, and the composition unit extracts, from the electromagnetic wave image, a plurality of partial images corresponding to the plurality of regions in the device image, respectively, and pastes each of the plurality of partial images to a corresponding one of the plurality of portions.

12. The design support apparatus according to claim 11, further comprising a 3D image generation unit configured to generate a 3D version of the CAD drawing in accordance with a designated viewpoint, wherein the composition unit causes the display unit to superimpose and display, on each of the plurality of portions in the 3D version, a converted image obtained by converting a corresponding one of the plurality of partial images in accordance with the viewpoint.

13. The design support apparatus according to claim 1, wherein the setting unit sets the plurality of pointers to specify a plurality of electromagnetic wave images corresponding to a plurality of captured images obtained by capturing a plurality of surfaces of the electronic device, the CAD drawing includes a plurality of portions corresponding to the plurality of surfaces of the electronic device, respectively, and the composition unit configured to cause the display unit to display each of the plurality of electromagnetic wave images and a corresponding one of the plurality of portions in the superimposed manner such that each of the plurality of portions and a corresponding one of the plurality of captured images are aligned.

14. The design support apparatus according to claim 1, wherein alignment between the CAD drawing and the captured image includes performing at least one of deformation, movement, and rotation for at least one of the CAD drawing and the captured image.

15. The design support apparatus according to claim 1, wherein the composition unit extracts a first reference for alignment from the electromagnetic wave image, and performs alignment between the CAD drawing and the captured image such that the first reference and a second reference provided on the electronic device overlap.

16. The design support apparatus according to claim 15, wherein the composition unit extracts the first reference by detecting a mark from the electromagnetic wave image.

17. A design support method comprising:

a step of acquiring an electromagnetic wave image in which a captured image obtained by capturing an electronic device and a map obtained by mapping, in a two-dimensional space, an electromagnetic wave radiated from the electronic device are superimposed;

a composition step of causing a display unit to display a CAD drawing representing a shape of the electronic device and the electromagnetic wave image in a superimposed manner such that the CAD drawing and a device image that is an image of the electronic device in the captured image are aligned, wherein the composition step aligns the CAD drawing and the device image based on a plurality of pointers representing a region of the device image; and a setting step of setting the plurality of pointers automatically for the electromagnetic wave image in accordance with a predetermined rule for decision making.

18. A non-transitory computer readable medium storing a computer program configured to cause a computer to operate as a design support apparatus, the design support apparatus comprising:

an acquisition unit configured to acquire an electromagnetic wave image in which a captured image obtained by capturing an electronic device and a map obtained by mapping, in a two-dimensional space, a measurement result of an electromagnetic wave radiated from the electronic device are superimposed;

a composition unit configured to cause a display unit to display a CAD drawing representing a shape of the electronic device and the electromagnetic wave image in a superimposed manner such that the CAD drawing and a device image that is an image of the electronic device in the captured image are aligned, wherein the composition unit aligns the CAD drawing and the device image based on a plurality of pointers representing a region of the device image; and a setting unit configured to set the plurality of pointers automatically for the electromagnetic wave image in accordance with a predetermined rule for decision making.

* * * * *